United States Patent [19]
Garner et al.

[11] Patent Number: 6,052,030
[45] Date of Patent: Apr. 18, 2000

[54] LOW VOLTAGE VARIABLE GAIN AMPLIFIER WITH FEEDBACK

[75] Inventors: William J. Garner, Yardley, Pa.; Helen Kim, Holmdel, N.J.

[73] Assignee: Lucent Technologies Inc., Murray Hill, N.J.

[21] Appl. No.: 09/072,149

[22] Filed: May 4, 1998

[51] Int. Cl.$^7$ ........................................ H03G 3/12
[52] U.S. Cl. ................................. 330/282; 330/86
[58] Field of Search ........................... 330/282, 86, 98, 330/99, 310, 311

[56] References Cited

U.S. PATENT DOCUMENTS

| | | | |
|---|---|---|---|
| 4,608,542 | 8/1986 | Siegel | 330/282 |
| 4,612,514 | 9/1986 | Shigaki et al. | 330/282 |
| 4,764,732 | 8/1988 | Dion | 330/293 |
| 5,363,064 | 11/1994 | Mikamura | 330/308 |
| 5,465,407 | 11/1995 | Hashimoto | 330/129 |
| 5,602,510 | 2/1997 | Bayruns et al. | 330/282 |

OTHER PUBLICATIONS

Robert G. Meyers, William D. Mack, A Wideband Low–Noise Variable Gain BiCMOS Transimpedance Amplifier, 1994 IEEE Journal of Solid State Circuits, v.29, No. 6, Jun. 1994.

Gurkanwal Singh Sahota, Charles James Persico, High Dynamic Range Variable–Gain Amplifier for CDMA Wireless Applictions, 1997 IEEE International Solid–State Circuits Conference, Session 22.

*Primary Examiner*—Robert Pascal
*Assistant Examiner*—Khawh Van Nguyen

[57] ABSTRACT

An amplifier with negative feedback, disposed in an integrated circuit arrangement, comprises an input amplification stage, configured to receive an input signal. A feedback stage configured to receive the output signal provided by the amplification stage, and provide a corresponding feedback signal to the amplification stage. A driver stage, coupled to the input stage, configured to receive the output signal provided by the amplification stage, and provide the output signal of the amplifier.

38 Claims, 5 Drawing Sheets

IM₃ vs GAIN

LOW VOLTAGE VARIABLE GAIN AMPLIFIER WITH FEEDBACK

FIELD OF THE INVENTION

This invention relates to a feedback amplifier, and more specifically to a variable gain amplifier configured to operate in intermediate frequency (IF) range and substantially low rail-to-rail power supply voltage source.

BACKGROUND OF THE INVENTION

In cellular communications environment, a plurality of wireless terminals, such as cellular telephones, wireless local loop terminals, some cordless telephones, one-way and two-way pagers, PCS terminals and personal digital assistants, communicate with a corresponding base station. Each of these terminals are configured to handle a wide dynamic frequency and amplitude range. Typically, each wireless terminal includes a radio section that is employed to convert the radio frequency signals (RF) into baseband frequency signals. This conversion, in many instances include multiple intermediate frequency (IF) ranges. The baseband signals are then provided to a signal processing stage for conversion to an audio signal.

The first intermediate frequency (IF) range is typically between 80 MHZ to 200 MHZ. Signal levels amplified by intermediate frequency (IF) amplifiers exhibit a wide dynamic range. Thus, a high input signal level may cause saturation in the signal processing stage. One way to avoid this saturation is to set the gain of the intermediate frequency (IF) amplifier low enough such that a high input signal level would not cause the saturation. However, with a lower gain, the efficiency of the amplifier decreases.

One way to reduce this distortion is to employ a doublet amplifier as illustrated in FIG. 1. Typically a doublet amplifier 32 includes an input transistor 20 that is employed as an amplifier. The base terminal of transistor 20 is configured to receive an input voltage signal via resistor 16 having a value $_p$ and a coupling capacitor 18. The collector terminal of transistor 20 is coupled to a positive power supply signal level, $V_{CC}$, via a biasing transistor 28 having a value $R_1$. The emitter terminal of transistor 20 is coupled to a ground signal level. The output port of transistor 20 is coupled to a base terminal of transistor 22. The emitter terminal of transistor 22 is coupled to a feedback resistor 26, having a value $R_2$, which in turn is coupled to the ground signal level. The collector terminal of transistor 22 is coupled to $V_{CC}$ via a biasing resistor 30. Feedback resistor 26 is coupled to the base terminal of transistor 20 via a second feedback resistor 24 having a value $R_3$.

Amplifier 32 is a shunt-series feedback amplifier with a closed loop gain $A_{fi}$ approximately equal to $-[1+R_3/R_4]$. The negative feedback reduces the distortion factors such as the third order intermodulation distortion factor, $IM_3$, by $(1+A_{oi}\beta)$, compared to the amplifier without the feedback and configured to maintain the same output level, where $A_{oi}$ is the gain of the amplifier without the feedback and $\beta$ is approximately equal to $$\beta = -\left(\frac{R_2}{R_2 + R_3}\right) \quad (1)$$

which is the fractional current fed back. Since this is a shunt-series feedback, the input signal to the amplifier is a current signal $i_i$, and the feedback signal is also a current signal. The current gain of the amplifier without feedback (open loop gain, $A_{oi}$) is $$A_{oi} = g_{m1} \quad (2)$$

$$\frac{g_{m2}}{1+g_{m2}(R_3 \| R_2)}[R_0 \| (R_3+R_2)\|r_{\pi_1}][R_4 \| (1+g_{m2}(R_1 \| R_2))r_{\pi_2}$$

where $g_{m1}$ and $g_{m2}$ are the transconductances of transistor 20 and transistor 22, respectively, and $r_{\pi 1}$ and $r_{\pi 2}$ are the small signal input shunt resistances of bipolar transistors 20 and 22. The closed loop current gain $A_{fi}$ is $$A_{fi} = \frac{A_{oi}}{1+A_{oi}\beta} \quad (3)$$

Then, the closed loop voltage gain, $A_{fv}$, $$A_{fv} = A_{fi} \times \frac{R_4}{R_0} \quad (4)$$

Since a large signal causes more distortion, the loop gain, $A_{oi}\beta$, must be increased when a large input signal is applied. Thus, the improvement in the third order intermodulation distortion, $IM_3$, is affected, among other things, by the open-loop gain$_{oi}$, A. However$_{oi}$, A is determined by transconductances, $g_{m1}$ and $g_{m2}$ as well as $R_1$, $R_2$, and $R_3$. The values of $g_m$s and Rs are constrained by what is known as the headroom of the circuit, which in turn is constrained by the supply voltage, $V_{CC}$. The headroom is typically defined as the maximum possible input voltage range, before a transistor configured to receive the input voltage signal fails to provide satisfactory amplification. As the supply voltage goes down to below 3 volts and further down to 2 volts, the available headroom value decreases for any given input signal. As a result conventional amplifier designs such as the one illustrated in FIG. 1 begin to operate in an unsatisfactory manner.

The headroom constraint can be illustrated by an example with reference to FIG. 1 for a situation where the supply voltage, $V_{CC}$, is approximately 2 volts. As illustrated, the potential at the base terminal of transistor 20 must be at least 0.8 volts ($V_{be}$) above the ground level to turn transistor 20 on. The potential at the base terminal of transistor 20 and the emitter terminal of transistor 22 is approximately equal. Thus, the potential at the collector terminal of transistor 20 must be at least twice, $V_{be}$, or approximately 1.6–1.75 volts. This leads to a substantially low voltage drop—approximately 0.4 volts—across resistor 30 ($R_1$). As a result the current flowing through the collector of transistor 20, $Ic_{20}$, is also relatively small.

The open loop gain of transistor 20 is affected by the transconductance, $gm_1$, which in turn depends on the value of collector current $Ic_{20}$, and further on $R_1$. A small value of collector current and resistance, $R_1$ leads to a small loop gain, and hence very little reduction in distortion.

For wireless terminal applications there is a continuous strive to decrease the power supply voltage source level. For example, currently many wireless terminals are configured to operate with power supply levels in the order of 2–3 volts. Although variable gain amplifiers have been previously used in various applications, there is a need for a variable gain amplifier that can operate with substantially low power supply signal source, $V_{CC}$, in the order of 2–3 volts, and can still exhibit desirable phase and frequency characteristics.

SUMMARY OF THE INVENTION

This need is met by the present invention which provides a variable gain amplifier that has an amplification stage and a variable feedback stage. The amplification stage includes an input amplifier. The variable feedback stage can be implemented by a MOS transistor that has an effective small signal resistance, $r_{ds}$, across its drain and source terminals. The value of this resistance may be controlled by a variable voltage provided at the gate of the MOS transistor. Furthermore, the amplifier includes a biasing stage that allows the input amplifier to operate with substantially low supply voltage. Advantageously, the problems with headroom described above are avoided.

In one embodiment of the invention, a variable gain amplifier comprises: (a) an amplification stage configured to receive an input signal; (b) a feedback stage configured to receive the output signal provided by the amplification stage, and provide a corresponding feedback signal to the amplification stage; and © a driving stage coupled to the input stage and configured to receive the same signal provided by the amplification stage.

The feedback stage employs a second bipolar transistor coupled to the variable resistor made of metal oxide semiconductor (MOS) transistor. The resistance value of the variable feedback transistor is controlled by the voltage signal provided to the gate of the MOS transistor. By coupling the same output signal to the feedback stage and the driving stage, amplifier provides additional headroom as compared to prior designs.

BRIEF DESCRIPTION OF THE DRAWINGS

The subject matter regarded as the invention is particularly pointed out and distinctly claimed in the concluding portion of the specification. The invention, however, both as to organization and method of operation, together with features, objects, and advantages thereof may best be understood by reference to the following detailed description when read with the accompanying drawings in which:

DETAILED DESCRIPTION

Figure 2:
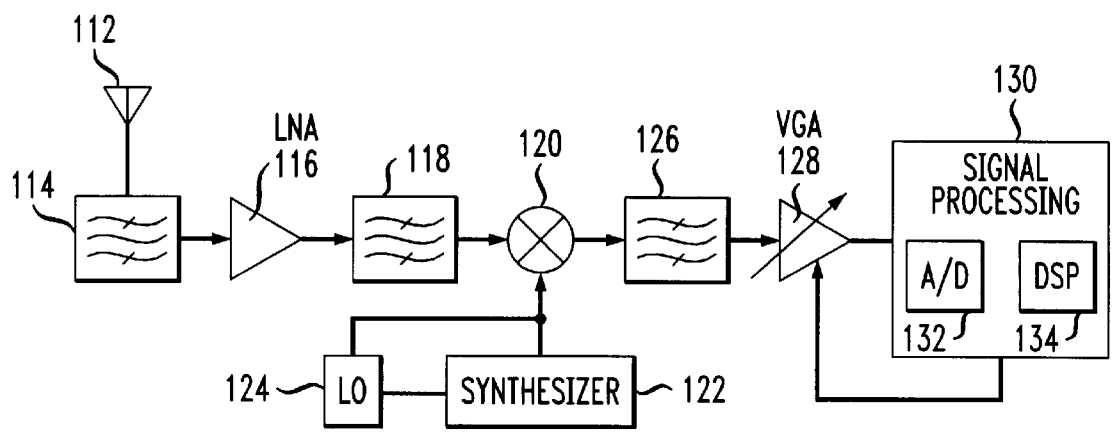
FIG. 2 is a block diagram of a receiving stage of a wireless terminal in accordance with one embodiment of the present invention.

FIG. 2 illustrates a general block diagram of a receiving stage of a wireless terminal wherein one embodiment of an intermediate frequency (IF) amplifier in accordance with the present invention may be used, although the invention is not limited in scope in that respect. Antenna 112 is configured to receive radio frequency (RF) signals, which are then routed to an input port of a bandpass filter 114 so as to provide signals within a selected radio frequency, RF band. The output signals provided by filter 114 are then fed to an input port of a low noise amplifier 116. The output port of amplifier 116 is coupled to an input port of a filter 118. The output port of filter 118 is in turn coupled to an input port of a mixer 120. The other input port of mixer 120 is configured to receive a signal from a synthesizer 122, for the arrangement wherein the desired channel is selected at this stage. For the arrangement wherein the desired channel is selected at a later stage, mixer 120 is configured to receive a signal generated by a local oscillator such as 124.

The output port of mixer 120 provides an intermediate frequency (IF) amplifier to an input port of a filter 126, which in turn provides a filtered signal to a variable gain amplifier 128 which is configured in accordance with the present invention.

The output port of variable gain amplifier 128 is coupled to an input port of a signal processing circuit 130, which as part of its functions, monitors the signal level provided by the output port of the variable gain amplifier. Signal processing circuit 130 provides a feedback control signal to an input port of variable gain amplifier 128 such that the signal level generated at the output port of the variable gain amplifier remains within a predetermined range as specified by signal processing circuit 130 in accordance with appropriate design consideration. It is noted that the output signal of variable gain amplifier 128 may be provided to additional mixers (not shown) prior to its reception by the signal processing circuit.

Signal processing circuit 130 includes an analog to digital A/D converter 132 which is configured to convert the received analog signals into digital signals. Signal processing circuit 130 also includes a digital signal processing circuit 134, which is employed to accomplish the tasks specified by signal processing circuit 130, in accordance with a communication protocol.

Intermediate frequency, IF, amplifier 128 with variable gain control is expected to handle 40–60 dB of gain variation, and provide a substantially constant output signal level with a constant distortion level, such that the dynamic range of the analog to digital, A/D converter is substantially maintained. A constant output signal level with the same distortion level is necessary so as to avoid non-linear responses in the signal processing stage. Therefore, with a variable gain amplifier, when the input to the receiver is a large signal, the amplifier sets a smaller gain, and conversely, when the input to the receiver is a small signal, the amplifier sets a higher gain.

Figure 3:
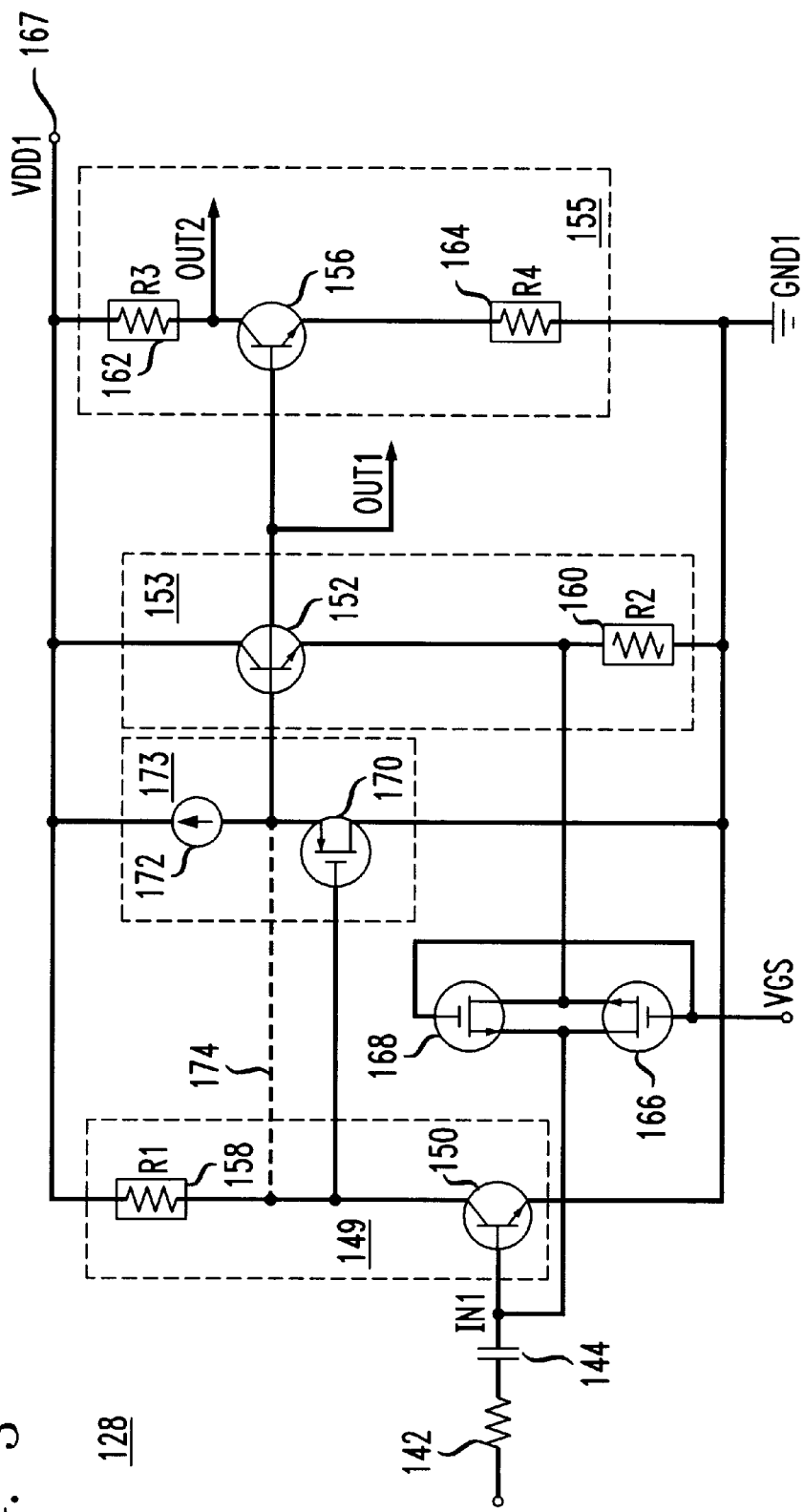
FIG. 3 illustrates a schematic diagram of a low voltage variable gain amplifier with negative feedback in accordance with one embodiment of the present invention.

FIG. 3 illustrates a variable gain amplifier 128 in accordance with one embodiment of the present invention, although the invention is not limited in scope in that respect. Variable gain amplifier 128 comprises an input amplification stage 149 which includes a first transistor 150, which in this embodiment is an NPN bipolar transistor. Alternatively, transistor 150 may also be an NMOS or some other type of transistor. The base terminal of transistor 150 receives a signal generated by IF bandpass filter 126 (FIG. 2), via a resistor 142 and a coupling capacitor 144. The collector of transistor 150 is coupled via a resistor 158 to a power supply voltage source 166 having a voltage signal level, $V_{DD}$, which is about 1.8–3 volts. In accordance with one embodiment of the present invention, the value of resistance 158, $R_1$, is approximately 800 ohms. Transistor 150 acts as an input amplification stage for amplifier 128.

The output signal developed at the collector terminal of transistor 150 is coupled to a biasing stage 173 that include a PMOS source follower. In the embodiment shown in FIG. 3, the PMOS source follower may include a PMOS transistor 170, although the invention is not limited in scope in that respect. Alternatively, the biasing stage may include an NPN bipolar transistor. Thus, the collector terminal of transistor 150 is coupled to the gate terminal of transistor 170. The source terminal of transistor 170 is coupled to power supply signal source, $V_{DD}$, via a current source 172. It is noted that the design and operation of current source 172 is well known and explained for example in *Analog Integrated Circuits*, Socolof, (Prentice Hall, 1985), incorporated herein by reference. The drain terminal of transistor 170 is coupled to the ground signal level. Transistor 170 and current source 172 make up biasing stage 173. The biasing stage sets a fixed biasing voltage signal at the source and gate terminals of transistor 170.

The source terminal of transistor 170 is coupled to a feedback stage 153 via base terminals of transistors 152 and to a driver stage 155 via base terminal of transistor 156. The collector terminal of transistor 152 is coupled to power supply signal source 167. The emitter terminal of transistor 152 is coupled to ground level via a resistor 160 having a value, $R_2$, which is approximately 1000 ohms in accordance with one embodiment of the present invention. Resistor 160 may be implemented by employing an NMOS transistor configured in a current source arrangement.

The emitter terminal of transistor 152 is also coupled to the base terminal of transistor 150 via MOSFET transistors 166, 168. The source terminal of transistor 166 is coupled to the drain terminal of transistor 168, and, the drain terminal of transistor 166 is coupled to the source terminal of transistor 168. The gate terminals of transistors 166, and 168 are coupled together. The source terminal of transistor 166 is coupled to the base terminal of transistor 150.

The gate terminals of transistors 166, 168, are configured to receive a control voltage signal from signal processing circuit 130 (FIG. 2). MOSFET transistors 166, 168 can function as a voltage-controlled resistor, as long as they are operating in their triode region, such that the difference of gate-source voltage and the threshold voltage, $V_{GS}-V_{th}$ is equal or larger than the drain source voltage, $V_{DS}$. The value of the resistance is controlled by the signal level of the voltage signal provided to gate terminal of transistors 166, 168. The coupling arrangement of transistors 166, and 168, provides a symmetric loading to input port of variable gain amplifier 128 and resistor 160. It also provides a substantially linear response.

$$r_{ds} = \frac{1}{\mu \times C_{OX} \times \frac{W}{L} \times (V_{GS} - V_{th} - V_{DS})} \quad (5)$$

wherein $\mu$ is the mobility of electrons, $C_{OX}$ is the oxide capacitance, W is the gate width and L is the gate length of the transistor area, $V_{GS}$ is the gate-source voltage signal potential, $V_{DS}$ is the drain-source voltage signal potential and $V_{th}$ is the threshold level voltage signal. Since $V_{DS}$ is almost zero, and $V_{th}$ is fixed, $r_{ds}$ can be varied as a function of $V_{GS}$ for a given ratio of width to length W/L.

In accordance with one embodiment of the invention, the transistors employed in amplifier 128 are made based on $0.5\mu$ technology. Thus, for this example, the two NMOS transistors 166 and 168 have a W/L ratio of approximately 10 to provide a variable resistance ranging from about 500 to about 10000 ohms as the gate-source voltage, $V_{GS}$ varies from the power supply level, $V_{DD}$, to the threshold voltage of the transistor, $V_{th}$. During operation, transistors 166, 168 act as a feedback stage, which provide a feedback voltage signal to the amplification stage of amplifier 128.

As mentioned before, current source 172 sets a fixed biasing voltage at the gate and source terminals of transistor 170. Therefore, the biasing voltage of the emitter terminal of transistor 152 is also substantially fixed. Because of the feedback configuration, the biasing voltages at the emitter terminal of transistor 152 and base terminal of transistor 150, are substantially equal. In accordance with this embodiment of the invention, the presence of source follower 170 allows the biasing voltage at transistors 152 and 150 to remain substantially fixed. However, it is appreciated that in accordance with another embodiment of the invention, amplifier 128 is configured without a biasing stage. In that event, the collector terminal of transistor 150 is directly coupled to the base terminals of transistors 152 and 156 as illustrated by the dotted line 174.

As illustrated in FIG. 3, the output port of first amplification stage 149 of amplifier 128 is coupled to driver stage 155 comprising an output driver amplifier, such as transistor 156, via PMOS source follower 170. As such, the load at the output of amplifier 128 will not affect the feedback stage of the amplifier. Transistor 156 in accordance with one embodiment of the invention is a bipolar transistor. The emitter terminal of transistor 156 is coupled to the ground signal level via a resistor 164 having a value $R_4$. The collector terminal of transistor 156 is coupled to the power supply signal level, $V_{DD}$, via a resistor 162 having a value $R_3$. For this embodiment of the invention, $R_4$ and $R_5$ are both 800 ohms. The output port of driver transistor 156 is coupled to signal processing circuit 130 (FIG. 2).

Driver amplifier 156 in this embodiment of the invention has a unity gain, although other gains may be employed. For example, the driver stage of amplifier 128 can provide additional gain by varying the value of resistors 164 and 162 respectively.

It is noted that amplifier 128 may be implemented in an integrated circuit arrangement employing a modular BiCMOS integrated circuit manufacturing process.

Figure 1:
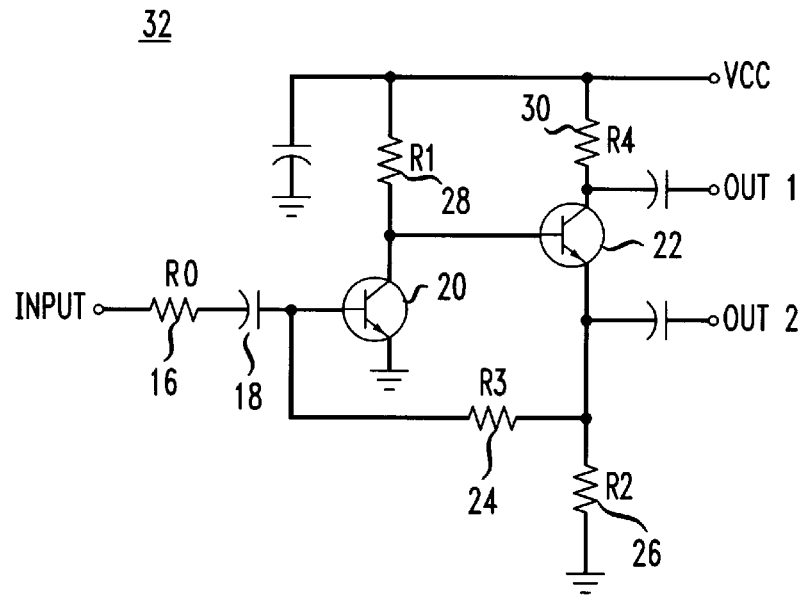
FIG. 1 is a prior art doublet amplifier with a negative feedback.

It is further noted that, advantageously, by using PMOS transistor 170, the headroom concerns are substantially eliminated. Transistor 170 allows for a large voltage drop across resistor 158 ($R_1$). This follows because the potential at the collector terminal of transistor 150 can be $V_{be}$ (0.8) volts above the ground level instead of twice that amount as called for in the doublet amplifier explained in reference with FIG. 1. Thus, for a supply voltage of 2 volts, and the same value of resistance $R_1$ in both circuits illustrated in FIGS. 1 and 3, the transconductance of transistor 150 can be 3 times larger than the transconductance of transistor 20 in FIG. 1. This implies that the open loop gain, and thus, the loop gain of amplifier 128 can be 3 times larger than the loop gain of doublet 32. This leads to an effective reduction on the order of 9.5 dB. As it can be appreciated by those skilled in the art, the output port of amplifier 128 experiences an acceptable voltage signal swing.

Figure 4:
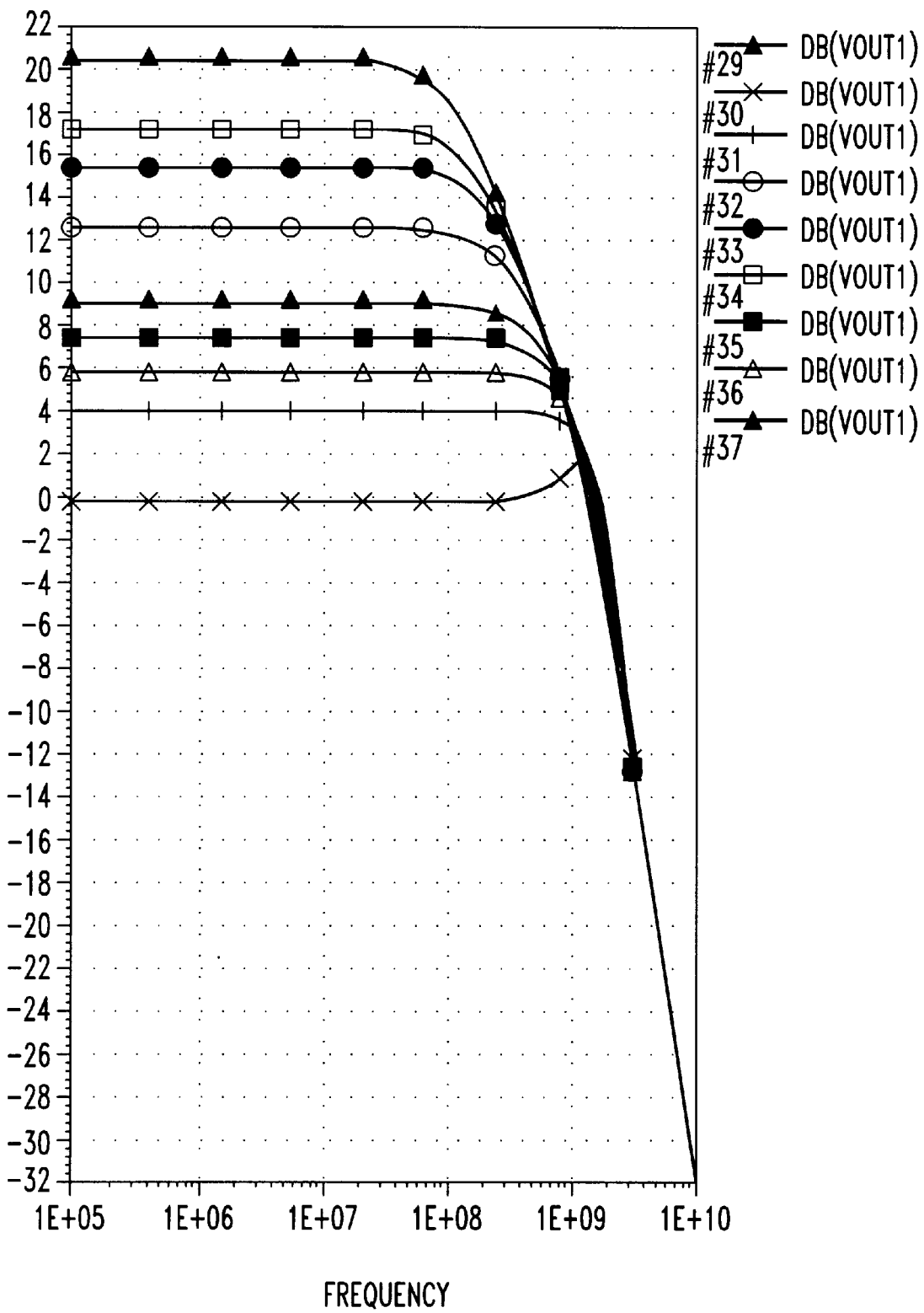
FIG. 4 illustrates a frequency response plot of the low voltage variable gain amplifier of FIG. 3 in accordance with the present invention.
Figure 5:
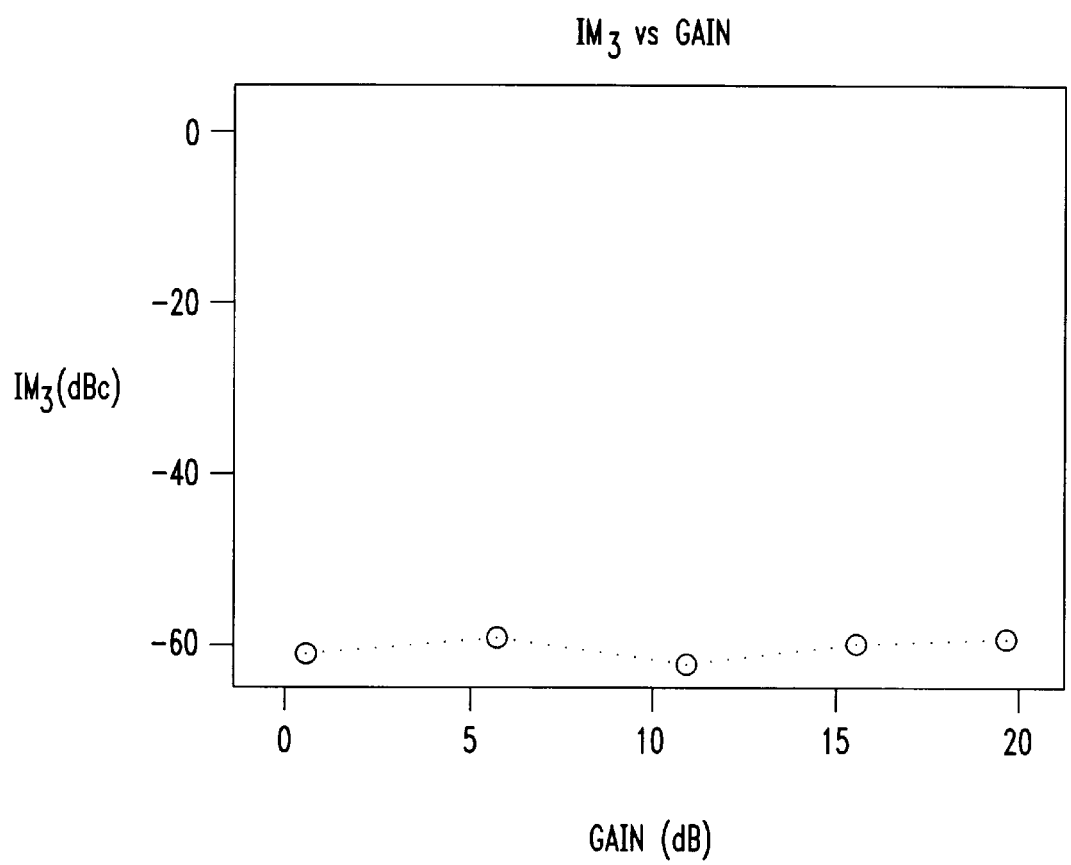
FIG. 5 illustrates the distortion characteristics of a variable gain amplifier of FIG. 3 with and without negative feedback.

FIG. 4 illustrates a frequency response plot of amplifier 128 in response to an AC signal sweep input for various values of a voltage signal provided to the gate of transistors 166 and 168 (FIG. 3). As illustrated the frequency response of amplifier 128 is considerably flat over its operating range. Furthermore, FIG. 5 is a plot illustrating the third intermodulation distortion, $IM_3$, of amplifier 128 (FIG. 3). The plot in FIG. 5 was generated by applying two separate frequency tones, for example 100 MHZ and 150 MHZ respectively, to the input port of amplifier 128 and measuring the third intermodulation distortion at the output port of amplifier 128. The input voltage signal was increased to maintain the same output voltage as the gain was decreased by varying the resistance in NMOS transistors 166, 168. The third intermodulation distortions signal, $IM_3$, is maintained at about −60 dB as gain varies from 20 to 0 dB. Curve 212 illustrates the distortion with the feedback in accordance with the amplifier illustrated in FIG. 3 in accordance with the present invention.

Figure 6A:
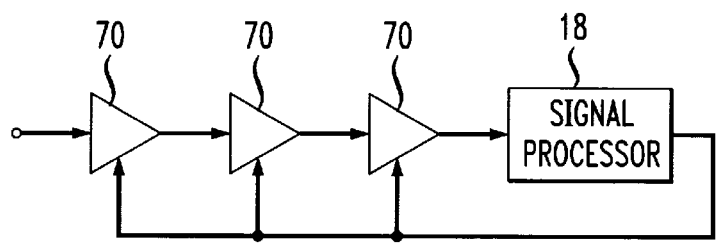
FIGS. 6(*a*) and 6(*b*) illustrate a block diagram of a multistage amplifier in accordance with one embodiment of the present invention and the corresponding frequency response plot.
Figure 6B:
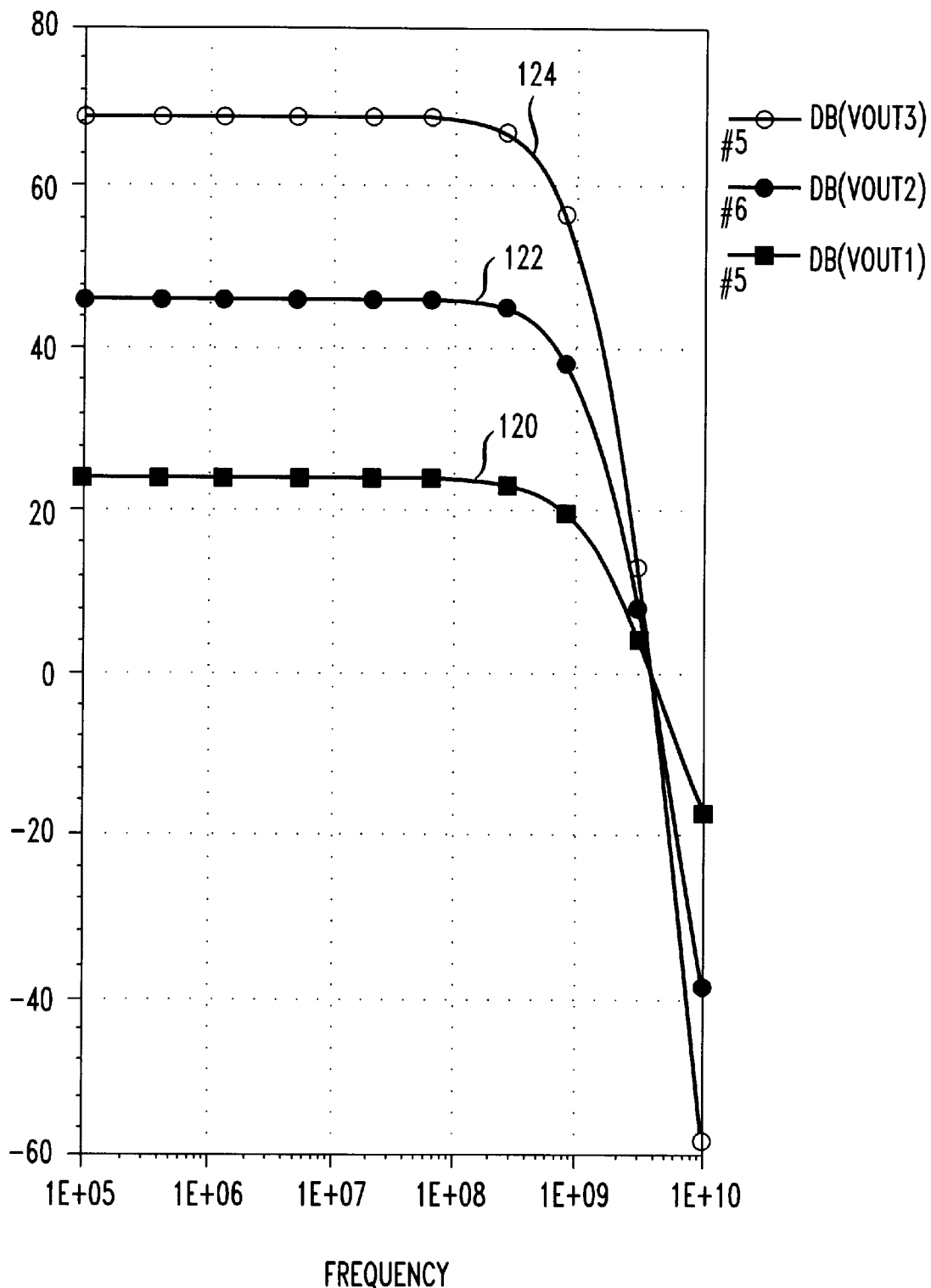

It is noted that several amplifiers such as amplifier 128 can be connected in a cascade arrangement so as to increase the overall gain. FIG. 6a illustrates a three stage cascade amplifier wherein each amplifier is configured such as amplifier 128 of FIG. 3. FIG. 6b illustrates the frequency response at the output port of each one of the amplifiers. Thus, curve 220 is the frequency response plot of the first stage, curve 222 is the frequency response plot of the second stage and curve 224 is the frequency response plot of the last stage respectively. It is noted that the overall frequency response is still substantially flat over the desired input frequency range.

Thus, in accordance with the present invention a variable gain amplifier having negative feedback is capable to operate with a substantially low power signal level source. Furthermore, in accordance with the present invention, the variable gain amplifier exhibits a substantially flat frequency response within a desired range and is capable of substantially reducing intermodulation distortion.

The foregoing merely illustrates the principles of the inventions. It will thus be appreciated that those skilled in the art will be able to devise various arrangements which, although not explicitly described or shown herein, embody the principles of the invention and are thus within its spirit and scope.

We claim:

1. A variable gain amplifier comprising:
   an input amplification stage for receiving an input signal and providing an amplified output signal;
   a feedback stage for receiving said amplified output signal provided by said input amplification stage, and providing as a function thereof a feedback signal to said input amplification stage; and
   a driver stage, coupled to said input amplification stage, configured to receive said amplified output signal provided by said input amplification stage, and provide the output signal of said variable gain amplifier.

2. An amplifier in accordance with claim 1 wherein said function is developed as a variable resistance.

3. An amplifier in accordance with claim 2 wherein said variable resistance is implemented by a transistor.

4. An amplifier in accordance with claim 3 wherein said variable resistance is controlled by a signal supplied from outside said amplifier.

5. An amplifier in accordance with claim 1 wherein said feedback stage provides a variable feedback signal.

6. An amplifier in accordance with claim 5 wherein said feedback signal is generated by a variable resistance.

7. An amplifier in accordance with claim 5 wherein said variable feedback signal is generated by a transistor coupled between the output port of said feedback stage and the input port of said input amplification stage.

8. An amplifier in accordance with claim 7 wherein said transistor coupled between the output ports of said feedback stage and the input port of said input amplification stage is a MOSFET transistor providing a variable resistance across its drain and source terminals in response to input voltage signals provided at its gate terminal.

9. An amplifier in accordance with claim 7 wherein said input amplification stage comprises an input transistor configured to amplify input signals provided to said input transistor.

10. An amplifier in accordance with claim 9 wherein said feedback stage comprises a feedback transistor, configured to receive amplified signals generated by said input transistor.

11. An amplifier in accordance with claim 10 wherein said driver stage comprises a transistor configured to receive said amplified signals generated by said input transistor.

12. An amplifier in accordance with claim 11 wherein said transistor coupled between the output port of said feedback stage and the input port of said input amplification stage is a MOSFET transistor providing a variable resistance across its drain and source terminals in response to input voltage signals provided at its gate terminal.

13. An amplifier in accordance with claim 12 wherein said transistors in said input amplification stage, said feedback stage and said driver stage are bipolar transistors.

14. A multiple stage amplifier comprising a plurality of amplifiers in accordance with claim 13, wherein said amplifiers are coupled in a cascade arrangement.

15. An amplifier in accordance with claim 13 disposed in an integrated circuit arrangement.

16. A wireless terminal having an intermediate frequency amplifier comprising:
   an input amplification stage configured to receive an input signal having an intermediate frequency (IF) range and to provide an amplified output signal;
   a feedback stage configured to receive the amplified output signal provided by said amplification stage, and provide a corresponding feedback signal to said amplification stage, said feedback signal being responsive to a feedback control signal;
   a driver stage coupled to said input amplification stage configured to receive said amplified output signal provided by said input amplification stage, and provide the output signal of said intermediate frequency amplifier; and
   a signal processing circuit configured to receive a signal corresponding to said output signal of said intermediate frequency amplifier and provide said feedback control signal to said feedback stage.

17. A wireless terminal in accordance with claim 16 wherein said feedback stage provides a variable feedback signal.

18. A wireless terminal in accordance with claim 17 wherein said variable feedback signal is generated by a transistor coupled between the output port of said feedback stage and the input port of said input amplification stage.

19. A wireless terminal in accordance with claim 18 wherein said transistor coupled between the output port of said feedback stage and the input port of said input amplification stage is a MOSFET transistor providing a variable resistance across its drain and source terminals in response to said feedback control voltage signals provided at its gate terminal.

20. A wireless terminal in accordance with claim 19 wherein said input amplification stage comprises an input transistor configured to amplify input signals provided to said input transistor.

21. A wireless terminal in accordance with claim 20 wherein said feedback stage comprises a feedback transistor, configured to receive amplified signals generated by said input transistor.

22. A wireless terminal in accordance with claim 21 wherein said driver stage comprises a transistor configured to receive said amplified signals generated by said input transistor.

23. A wireless terminal in accordance with claim 22 wherein said transistor coupled between the output port of said feedback stage and the input port of said input amplification stage is a MOSFET transistor providing a variable resistance across its drain and source terminals in response to said feedback control voltage signals provided at its gate terminal.

24. An amplifier in accordance with claim 23 wherein said transistors in said input amplification stage, said feedback stage and said driver stage are bipolar transistors.

25. An amplifier comprising:

an input amplification means for receiving and amplifying an input signal, said input amplification means including an output port for providing an amplified output signal;

a biasing means coupled to said input amplification means for providing a substantially fixed biasing voltage at said output port of said input amplification means;

a feedback means coupled to said biasing means for receiving said amplified output signal provided by said input amplification means via said biasing means, and providing a corresponding feedback signal to said input amplification means; and a driver means coupled to said input amplification means via said biasing means for receiving said amplified output signal provided by said amplification means, and providing the output signal of said amplifier.

26. An amplifier in accordance with claim 25 wherein said feedback means provides a variable feedback signal.

27. An amplifier in accordance with claim 26 wherein said variable feedback signal is generated by at least one transistor coupled between the output port of said feedback means and the input port of said input amplification means.

28. An amplifier in accordance with claim 27 wherein said at least one transistor coupled between the output ports of said feedback means and the input port of said input amplification means is a MOSFET transistor providing a variable resistance across its drain and source terminals in response to input voltage signals provided at its gate terminal.

29. An amplifier in accordance with claim 28 wherein said input amplification means comprises an input transistor configured to amplify input signals provided to said input transistor.

30. An amplifier in accordance with claim 29 wherein said feedback means comprises a feedback transistor, configured to receive amplified signals generated by said input transistor via said biasing means.

31. An amplifier in accordance with claim 30 wherein said driver means comprises a transistor configured to receive said amplified signals generated by said input transistor.

32. An amplifier in accordance with claim 31 wherein said transistor coupled between the output port of said feedback means and the input port of said input amplification means is a MOSFET transistor providing a variable resistance across its drain and source terminals in response to input voltage signals provided at its gate terminal.

33. An amplifier in accordance with claim 32 wherein said transistors in said input amplification means, said feedback means and said driver means are bipolar transistors.

34. A multiple stage amplifier comprising a plurality of amplifiers in accordance with claim 32, wherein said amplifiers are coupled in a cascade arrangement.

35. An amplifier in accordance with claim 33 wherein said biasing means comprises a PMOS source follower transistor and a current source, wherein said source follower is coupled to a DC power supply signal source via said current source.

36. A method for providing variable gain amplification comprising the steps of:

receiving and amplifying an input signal via an input amplification means, and providing an amplified version of said input signal;

providing a substantially fixed biasing voltage via a biasing means at an output port of said amplification means;

receiving said amplified version of said input signal provided by said input amplification means via said biasing means, and providing a corresponding feedback signal to said input amplification means; and receiving said amplified version of said input signal provided by said amplification means, and providing the output signal of said amplifier via a driving means.

37. The method in accordance with claim 36 further comprising the step of providing a variable feedback signal.

38. The method in accordance with claim 37 wherein said step of providing a variable feedback signal comprises varying a resistance across a drain a source terminal of a MOSFET transistor.

* * * * *